United States Patent
Barton

(10) Patent No.: US 6,465,344 B1
(45) Date of Patent: Oct. 15, 2002

(54) CRYSTAL THINNING METHOD FOR IMPROVED YIELD AND RELIABILITY

(75) Inventor: Jeffrey Brian Barton, Goleta, CA (US)

(73) Assignee: Indigo Systems Corporation, Goleta, CA (US)

( * ) Notice: Subject to any disclaimer, the term of this patent is extended or adjusted under 35 U.S.C. 154(b) by 0 days.

(21) Appl. No.: 09/802,448

(22) Filed: Mar. 9, 2001

(51) Int. Cl.[7] .......................................... H01L 21/4763
(52) U.S. Cl. ....................... 438/626; 438/464; 438/737; 438/454; 438/460
(58) Field of Search ................................ 438/626, 460, 438/464, 737, 454

(56) References Cited

U.S. PATENT DOCUMENTS

| | | | | |
|---|---|---|---|---|
| 4,395,451 A | * | 7/1983 | Althouse | .................... 428/141 |
| 5,286,656 A | * | 2/1994 | Keown et al. | .................. 437/7 |
| 5,340,772 A | * | 8/1994 | Rosotker | .................... 437/226 |
| 5,881,888 A | * | 3/1999 | Ohkawara et al. | .......... 209/552 |
| 5,883,008 A | * | 3/1999 | McClure | .................... 438/737 |

* cited by examiner

Primary Examiner—Richard Elms
Assistant Examiner—Pho M. Luu
(74) Attorney, Agent, or Firm—MacPherson Kwok Chen & Heid LLP

(57) ABSTRACT

Methods for forming die that have minimal edge and surface damage are provided. Die formed by these methods are less susceptible to cracking and breakage. Thus, yield and performance of devices fabricated with die formed by these methods are advantageously improved. To form the die, trenches are formed in a wafer around the peripheral edge of the die by processes that cause only minimal damage to the edges of the die. The wafer is cut through the trenches into sections containing the die without contacting the edge of the die. The sections are then mounted onto a holder and thinned to produce the die.

27 Claims, 5 Drawing Sheets

CRYSTAL THINNING METHOD FOR IMPROVED YIELD AND RELIABILITY

BACKGROUND OF THE INVENTION

1. Field of the Invention

The present invention relates to thinning and dicing of wafers. In particular, the present invention relates to a method of thinning and dicing wafers that reduces edge defects.

2. Description of the Background

Solid materials having semiconductor or opto-electronic properties are used in applications ranging from the well-known integrated circuits of computer technology to sensors and optical devices used in advanced communications. For these applications, the materials must often be cut, thinned, and polished to a precise size, to meet the dimensional tolerances and surface characteristics required by the application.

Bulk materials are usually first cut into sheets or wafers for subsequent processing, dicing, and thinning procedures. To create smaller pieces or sections of the material, the sheet or wafer is diced. Dicing is a term from the semiconductor industry and refers to cutting a semiconductor wafer into squares or rectangles known as "die". In semiconductor applications, circuitry has usually been fabricated into each die before it is cut. A semiconductor-dicing saw is used to saw the sheet or wafer into individual die.

Thinning is traditionally performed by mounting or bonding the material onto a substrate device and then using lapping, polishing, or diamond point turning systems to reduce the thickness of the material. In the manufacture of semiconductors, thinning is performed on a wafer or large piece of crystal material in which semiconductor processing may or may not have been performed. In other applications, the material may be thinned after the wafer or sheet is cut into die.

A problem with dicing and thinning is that these processes can damage the material. FIG. 1A illustrates a saw blade 100 cutting through a wafer 105 and producing a cut 110 in the material. As the saw blade 100 moves through wafer 105 it removes crystal material producing the cut. As illustrated in FIG. 1B, the saw also produces edge damage 120, in which chips, jagged edges, microcracks, fractures and other defects occur in the wafer material as the saw removes the material. Edge damage 120 occurs along sidewalls 125 of the cut 110 and surfaces 123 of wafer 105 near cut 110. Edge damage 120 also extends into the wafer 105 in the form of microcracks and fractures.

The die resulting from the dicing process may then be thinned. However, edge damage 120 is not removed by the thinning process. FIG. 2A illustrates an assembly 200 used for thinning die 210. Die 210 is cut from wafer 105 and mounted to a substrate 215, which may be an inactive mechanical support or an active electronic component, depending on the application of die 210. An adhesion material 218 such as epoxy or wax can be used to mount the die 210 to substrate 215. The location of the edge damage 120 on die 210 created by the dicing process is illustrated in the sectional view of FIG. 2B, taken along line I—I of FIG. 2A. Die 210 has an initial thickness $T_i$, illustrated in the expanded view of FIG. 2C.

The mounted die 210 is thinned from top surface 230. FIGS. 2D and 2E illustrate die 210 thinned to a final thickness $T_f$, which is less than the initial thickness $T_i$. The edge damage 120 remains in die 210 after thinning, and is thus present in the final application of die.

Edge damage 120 reduces the strength of the material of die 210, leaving it susceptible to cracking, which reduces the yield and performance of the device to be fabricated from the die. For example, when an integrated circuit chip is handled and packaged the silicon crystal is subjected to mechanical and temperature-induced stresses.

These stresses can cause the cracks in the damaged edge region to propagate into the active chip areas, damaging the chip circuitry and reducing the reliability of the integrated circuit.

Another application in which damage to the edge and surface of a die reduces yields and device performance is in infrared detection sensors, known as infrared focal plane arrays. In these sensors, two crystals, a detector die and a readout circuit chip, are bonded together to form the sensor. The detector die is typically composed of a material such as Si, Ge, InSb, HgCdTe, and InGaAs having an array of photodiodes formed therein. The readout circuit chip is typically a conventional silicon integrated circuit having the necessary circuitry for picking up the signals detected by the detector array, and amplifying and processing those signals for the specific monitoring application.

These sensors are particularly susceptible to cracking because they are operated at low temperature and the two crystals that form the sensor, the detector die and the readout circuit chip, have different thermal expansion coefficients. Therefore, when the sensor is cooled, the size of one of the crystals changes more than the other, introducing strain into the device and causing it to crack and fail. Most often it is the thinner and weaker detector crystal that cracks.

This problem has been addressed by designing sensors to minimize the strain between the two crystals as they cool, as described in U.S. Pat. No. 5,264,699 to Barton et al. and U.S. Pat. No. 5,308,980 to Barton. However, these methods do not directly address the defects that reduce the strength of the detector material. As with the integrated circuit chips described above, microcracks and other damage at the edges and surface can propagate into the crystal as it is strained when the device is cooled.

SUMMARY

In accordance with the embodiments of this invention, methods for forming die are provided which produce die that have minimal edge and surface damage. A trench is formed in a first surface of a wafer from which the die will be produced. The trench surrounds the die such that at least one sidewall of the trench forms the peripheral edge of the die. The depth of the sidewalls of the trench is at least as large as the thickness of the edge of the die after thinning. The trench is made by a method that causes minimal damage to the die.

Methods that can be used to form the trench with only minimal damage to the die include, for example, partial sawing, wet chemical etching, reactive ion etching, and ion milling. A combination of these methods can be used to create die having the desired sidewall straightness and edge damage. For example, partial sawing can form trenches with straight sidewalls and can be followed with a wet chemical etch to remove any damage created by the partial sawing. A protective coating is used to protect the first surface of the die and any circuitry or other structure that may be formed thereon.

The wafer is cut into sections that contain the die. A through-cut is produced that extends from the bottom surface of the trench to a second surface of the wafer that is opposite the first surface of the wafer to form the section.

The through-cut is displaced from the sidewall of the trench by a length so that a shelf is created on the section between the sidewall, which forms a peripheral edge of the die, and the through-cut.

The section is mounted onto a holder, which may be a substrate with an adhesion material between the substrate and the section. The section is mounted so that the first surface faces into the holder. The section is thinned from the second surface until the desired thickness is reached.

The substrate may be an integrated circuit readout chip, the adhesion material an epoxy, and the die an infrared sensitive crystal, thus forming an infrared sensor device.

DETAILED DESCRIPTION

Figure 3A:
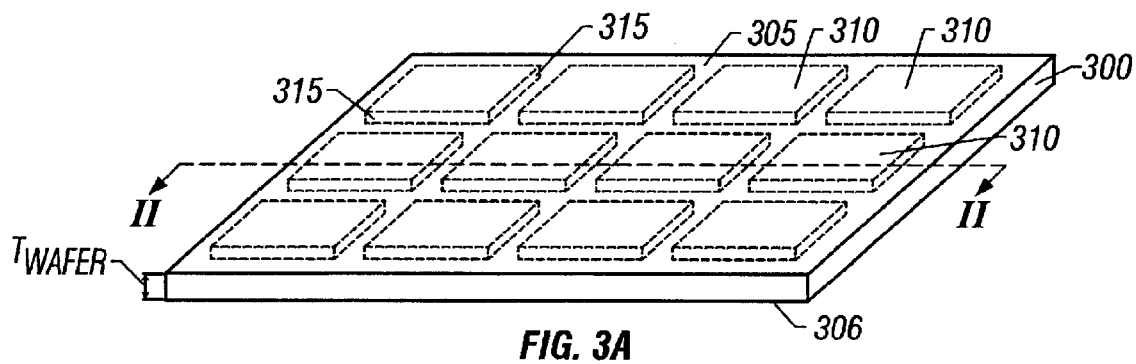
FIG. 3A is a perspective view of a wafer with die to be cut and thinned from the wafer indicated by dashed lines.
Figure 3B:
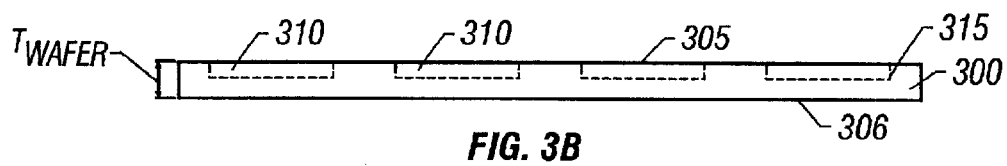
FIG. 3B is a sectional view of the wafer of FIG. 3A taken along line II—II.

FIGS. 3A and 3B illustrate a wafer 300 of material to be cut and thinned into die 310, which are outlined with dashed lines. The term "die" commonly refers to a rectangular or square section of semiconductor material containing integrated circuitry. As used herein, however, the term "die" encompasses any planar section of material that has been cut and thinned from a larger piece of that material. Die 310 need not be square or rectangular, and may or may not contain processed semiconductor devices or other structures, such as solder or indium bumps, formed thereon. Die 310 will have the dimensional and surface characteristics necessary for their intended application.

Wafer 300 may be any material that can be formed into die 310 in accordance with the embodiments of the invention. For example, wafer 300 may be a crystalline material, such as Si or Ge, used for semiconductor devices, or InSb, HgCdTe, CdTe, or InGaAs, which are used in infrared detectors, or other crystalline materials, e.g., sapphire. Wafer 300 may be a layered or composite material, a ceramic such as alumina, beryllia, or zirconia, or a non-crystalline material such as glass.

Wafer 300 is typically a sheet of material that has been sliced from a larger piece of the material. Wafer 300 may be lapped and/or etched to create a uniform finish on the wafer surfaces 305, 306. Wafer 300 typically has a thickness $T_{wafer}$ of between 300 μm (micron) and 1,000 μm.

Figure 4:
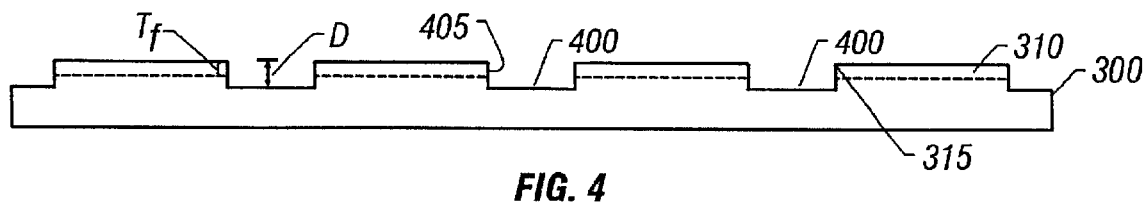
FIG. 4 is a sectional view of the wafer of FIG. 3B having trenches formed therein.

In the embodiments of the invention, material is removed from the top surface 305 of wafer 300 to create trenches 400 around each die 310, as illustrated in FIG. 4. The sidewalls 405 of the trenches 400 form the peripheral edges 315 of the die 310. The material is removed from upper surface 305 without creating defects, or creating only a very few defects, in the material. Thus, minimal damage is done to die 310 as the trenches 400 are formed, leaving damage-free, or nearly damage-free peripheral edges 315 for each die.

Material is removed so that the depth D of sidewalls 405 is slightly beyond the required final thickness $T_f$ of edge 315 of die 310. The required final thickness $T_f$ of edge 315 will depend on the intended application of die 310. For example, in infrared detectors, the thickness $T_j$ of die 310 is typically in the range of between 3 μm to 50 μm, and more typically in the range of between 10 μm to 30 μm.

Figure 2C:
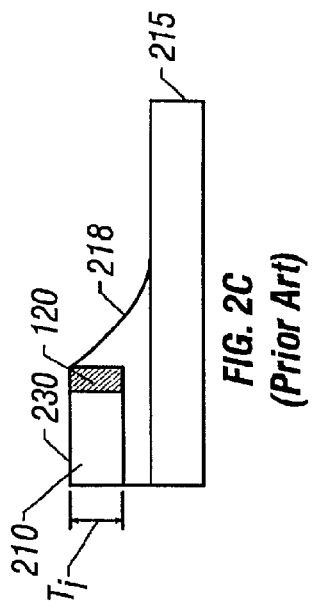
FIG. 2C is an enlarged view of section A of FIG. 2B, illustrating the location of the edge and surface damage to the die caused by sawing.
Figure 2B:
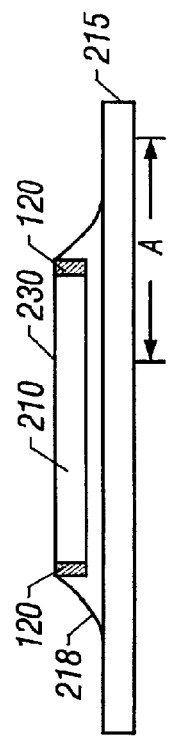
FIG. 2B is a cross-sectional view of the mounted die and substrate of FIG. 2A taken along line I—I of FIG. 2A.
Figure 2A:
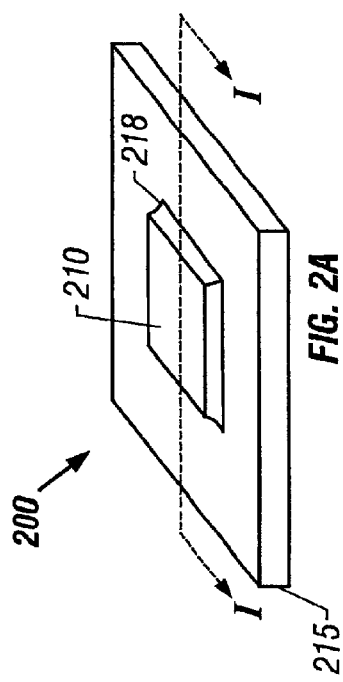
FIG. 2A is a perspective view of a die mounted on a substrate for thinning.
Figure 1A:
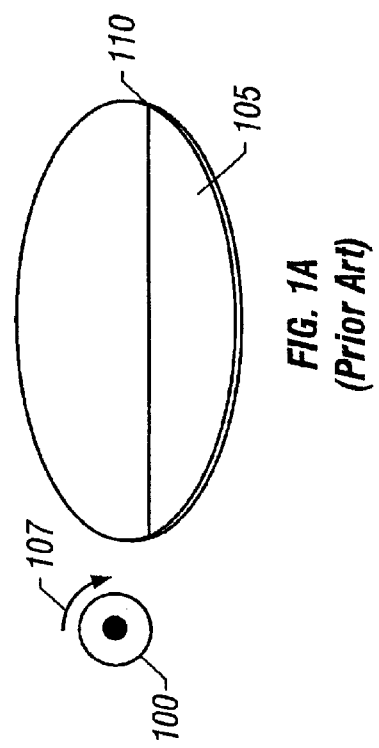
FIG. 1A is a perspective view of a wafer and saw blade. The wafer has been cut by the saw blade.
Figure 1B:
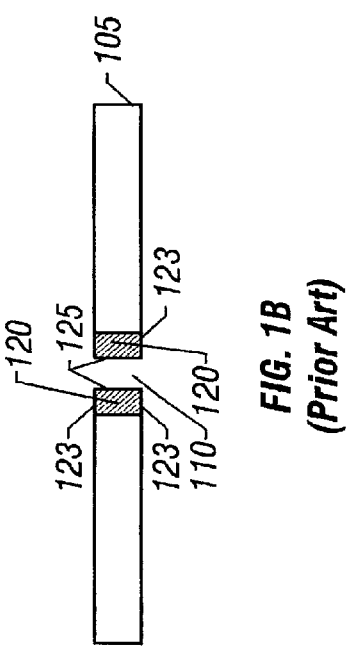
FIG. 1B is a cross-sectional view of a wafer that has been cut by a saw and the resulting damaged region.
Figure 2D:
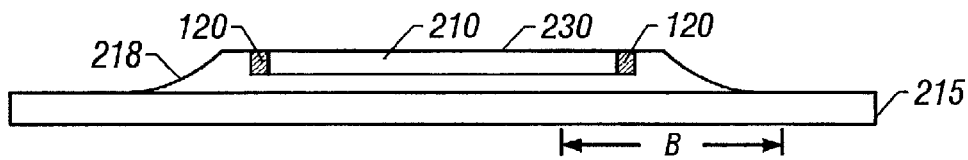
FIG. 2D is the cross-sectional view of FIG. 2B after the die has been thinned.
Figure 2E:
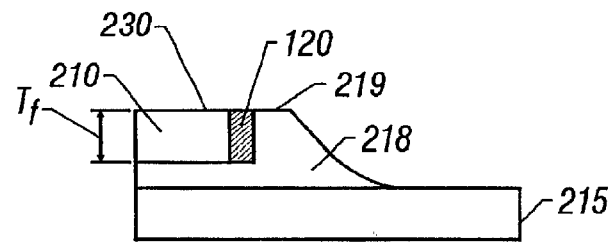
FIG. 2E is an enlarged view of section B of FIG. 2D, illustrating the location of the edge and surface damage to the die after thinning.

Suitable methods for removing material from surface 305 include, for example, etching processes, such as ion etching of the surface by wet chemistry, an ion milling of the surface, and reactive ion etching. Mechanical removal processes, such as partial sawing of the wafer material, may also be used. As defined herein, "partial sawing" refers to a method in which a dicing saw cuts only partially into the wafer, leaving a trench or groove in the wafer, without cutting all the way through the wafer. When partial sawing is used, typically only a shallow cut is made with the dicing saw, causing much less damage to the wafer material than a through-cut such as cut 110 of FIG. 1B. The choice of method used to form trench 400 depends on factors such as the material of wafer 300, the desired thickness of edge 315, the degree of damage the method causes to the sidewall, and the straightness of the sidewall produced by the method.

These factors will, in turn, depend on the intended application of die 310.

Of the methods listed above, reactive ion etching methods may be advantageous because these methods use low ion energies, which reduces damage to the edges 315 of die 310, while providing a high etch rate, which allows trench 400 to be formed quickly. Reactive ion etching also creates relatively straight sidewalls. In terms of damage produced, wet chemical etching generally leaves the fewest defects in the surface, followed by reactive ion etching, ion milling, and partial sawing. A problem, however, with wet chemical etching, particularly when an isotropic etching method is used, is that straight sidewalls are not produced. Wet etching methods that preferentially remove material in one direction of the crystal produce somewhat straighter sidewalls than isotropic etching, while still leaving the surface relatively damage-free. Ion milling and partial sawing generally create the most damage, but produce the straightest sidewalls. To produce the die 310 having straight sidewalls and minimally damaged edges, a process in which these methods are combined, such as the exemplary process sequence illustrated in FIGS. 5A–5F, can be used.

Figure 5A:
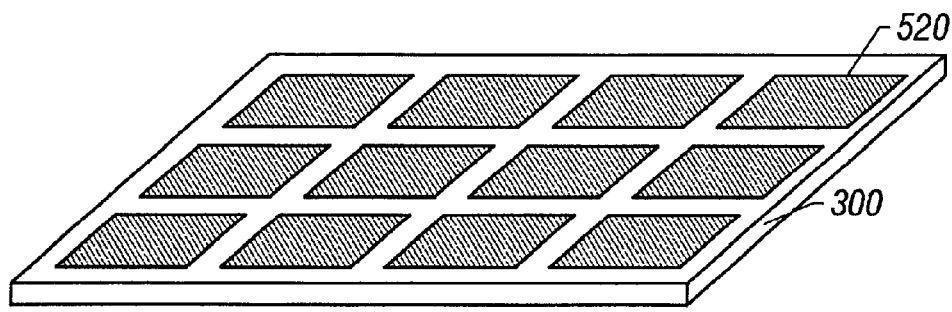
FIG. 5A is a perspective view and FIG. 5B a sectional view of the wafer of FIGS. 3A and 3B with a protective coating over the die.
Figure 5B:
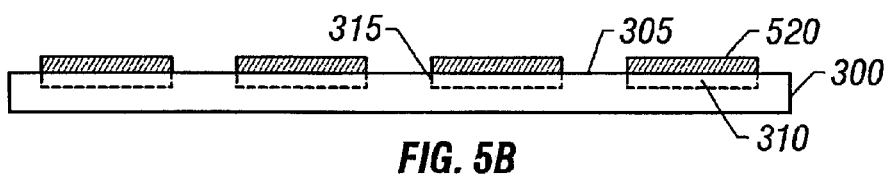
FIG. 5C is a sectional view of the wafer of FIG. 5B with trenches formed around the die and coating material.
FIG. 5D is an enlarged view of section C of FIG. 5C showing the damage along the bottom and sidewalls of the trench.
FIG. 5E is a sectional view showing the additional removal of material in the trenches after a wet chemical etching process.
FIG. 5F is an enlarged view of section E of FIG. 5E showing the trench after the wet etch and the removal of edge damage.

As illustrated in FIGS. 5A and 5B, a protective coating 520 is deposited or coated onto the surface of wafer 300 over die 310. When etching processes are used to remove material from surface 305, coating 520 serves as a mask for the regions that are not etched, to protect die 310 from removal of material and surface damage. When mechanical material removal processes are to be used, coating 520 protects any structures or circuitry that may have been formed on die 310 from debris, such as saw debris. An exemplary coating 520 may be a photoresist material, for example Shipley 1845 (Shipley Company, Marlborough, Mass.), which is applied using conventional methods. Those skilled in the art will recognize that a variety of other protective coatings, such as patterned silicon nitride or silicon dioxide, may be used.

Figure 5C:
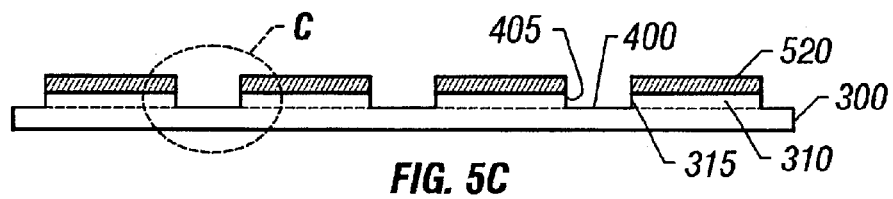
Figure 5D:
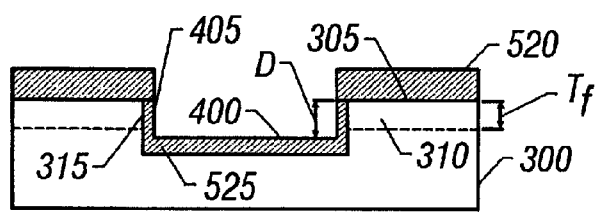

As illustrated in FIGS. 5C and 5D, trench 400 is then created by a method, for example, partial sawing, which creates straight sidewalls. In partial sawing, a shallow cut is made with a dicing saw. Unlike a cut which goes all the way through the wafer 300, such as cut 110 illustrated in FIGS. 1A and 1B, such a shallow cut produces only a very small amount of damage to the edges of die 310.

To minimize any damage that may be caused by partial sawing, the depth D of sidewalls 405 made by partial sawing should be as little beyond the final thickness $T_f$ of edge 315 as possible, because, in general, the deeper the saw cut the more damage produced in the material. The direction of rotation of the saw blade should also be down into the wafer, as illustrated by arrow 107 of FIG. 1A, to reduce damage. Higher blade rotation rates, for example 20,000 rpm or greater on a 2 inch (5.1 cm) diameter blade, and slower feed rates, for example 10 mm/minute, also minimize damage. The saw blade is typically a resin-bonded blade having a width of, for example, 0.05 to 0.2 mm, typically 0.1 mm, with embedded diamond grit having a grit size of, for example, 3 $\mu$m to 9 $\mu$m. Smaller grit generally produces less damage to the crystal, but the diamond grit must be large enough to produce a cut. Such a blade can be used in, for example, an MTI NSX-250 dicing saw (Manufacturing Technology, Inc., Ventura, Calif.).

Other material removal methods that produce straight sidewalls, such as reactive ion etching or ion milling can also be used to produce trench 400 of FIGS. 5C and 5D. When trench 400 is to be formed by these method, the choice of chemicals and procedures used will depend on the material of wafer 300 and the desired depth of trench 400, as understood by one of skill in the art.

FIG. 5D illustrates some limited damage 525 that may have been done to the edges 315 in forming trench 400 with straight sidewalls. This limited damage 525 may be acceptable, depending on the intended application of die 310 and the particular material of wafer 300, in which case wafer 300 is directly cut into sections, as described below in reference to FIGS. 6A–6C.

Figure 5E:
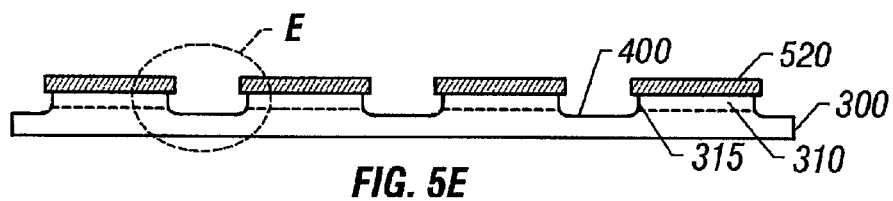
Figure 5F:
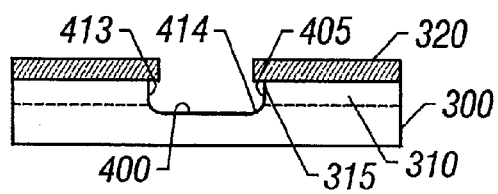

To remove any damage 525 from the sidewalls 405 of trench 400 and produce a damage-free surface, a wet chemical etch may be performed. The results of such a wet chemical etch are shown in FIGS. 5E and 5F. The wet etch process removes a small amount of material, for example, 2 $\mu$m to 10 $\mu$m, from the sidewalls and bottom of trench 400, and also cleans the surface of the trench. The resulting sidewalls 405 of trench 400 are as defect free as possible, but some undercutting 413 and rounding 414 may result. The wet chemical etch is performed using the procedure and chemicals appropriate for the material being etched, as understood by those of skill in the art.

Figure 6A:
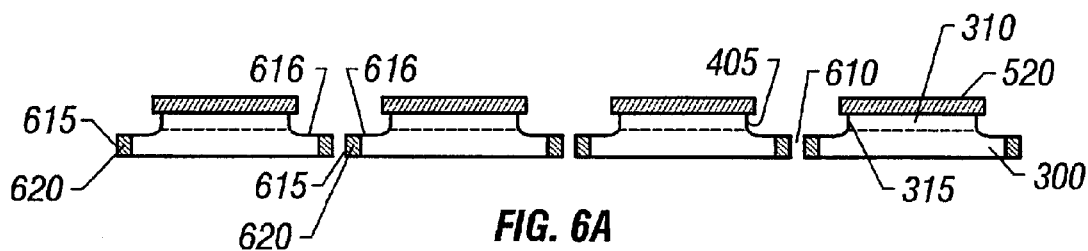
FIG. 6A is a side view of the wafer after being cut through each trench into sections, and the edge and surface damage caused by the through-cut.

Once trenches 400 are completed, wafer 300 is ready to be cut and divided into the individual sections from which each die 310 will be formed. As illustrated in FIG. 6A, a through-cut 610 is made within the trench 400 through wafer 300, such that the dicing saw does not contact the sidewall 405 of the trench. Trench 400 is made and cut so that a region of the trench, shelf 616, isolates the edge 315 from through-cut 610 and from damage due to the dicing saw. Shelf 616 extends from the sidewall 405 of trench 400 to the sidewall 615 of the through-cut 610, and should be long enough so that damage 620 caused by the dicing saw does not reach die 310. Typically, this length is at least the width of a saw blade, for example, 0.1 mm, used cut trench 400. Larger shelf lengths provide more protection but sacrifice more material. In general, a shelf 616 length of up to, e.g., 2.5 mm can be used. Thus, sidewall 405, which forms the peripheral edge 315 of die 310, is protected from damage.

Figure 6B:
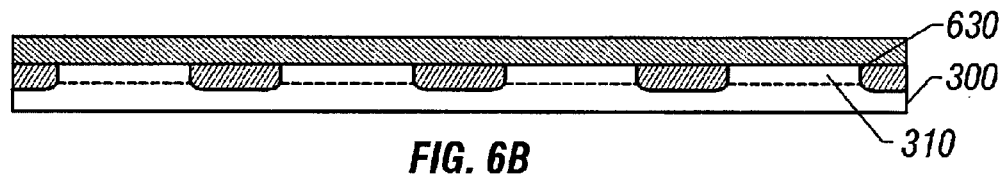
FIGS. 6B and 6C illustrate an embodiment in which a protective coating is applied to cover the surface of the die and the trenches before the wafer is cut into sections through each trench.
Figure 6C:
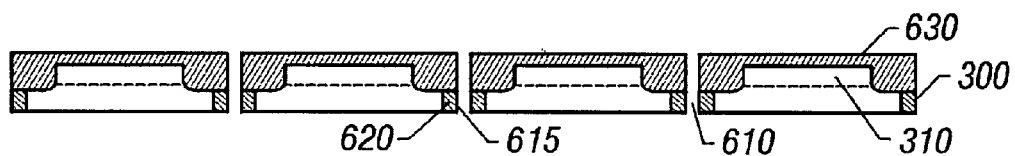

In FIG. 6A, the protective coating 520 from the previous processing is illustrated as remaining on wafer 300 during cutting of through-cut 610. However, if additional protection for sidewalls 405 is desired, the coating 520 may be removed, and, as illustrated in FIGS. 6B and 6C, another layer of coating 630 that covers the sidewalls 405 may be applied to wafer 300. The wafer is then cut, with the dicing saw moving through both the wafer 300 and coating material 630, to produce cut 610.

Figure 7A:
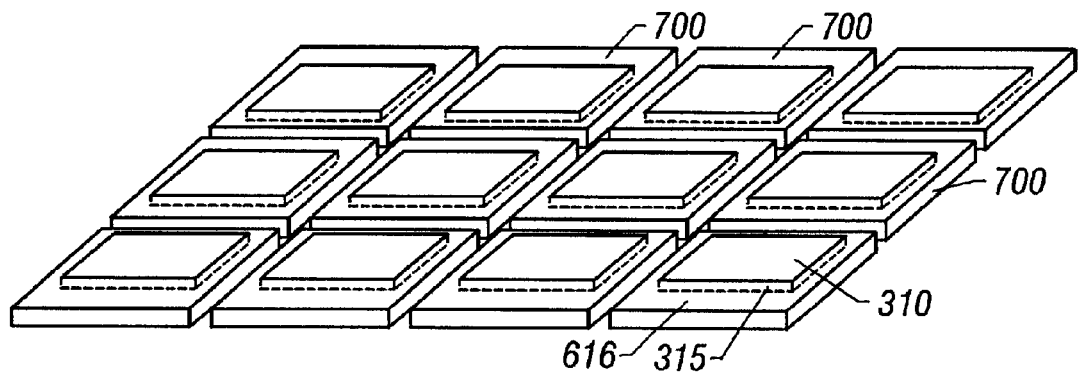
FIGS. 7A and 7B illustrate a perspective and sectional view, respectively, of each section of the wafer after the protective coating has been removed.
Figure 7B:
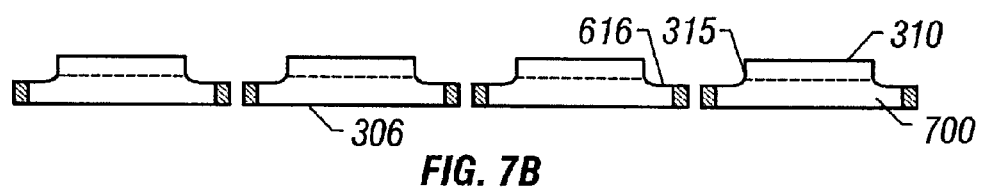

As illustrated in FIGS. 7A and 7B, after wafer 300 is cut, any protective coating 520 or 630 on the wafer 300 is removed, leaving sections 700. Each section 700 contains a partially formed die 310 on an upper portion of wafer 300. The shelf 616 forms a buffer region which allows each section 700 to be handled at sidewall 615 without touching the edge 315, further protecting edge 315 from damage that may result from handling sections 700.

It should also be noted that cutting the wafer 300 into sections 700 may be done before the wet chemical etch illustrated in FIGS. 5E and 5F is performed. In this case, the wet etch is performed after through-cut 610 is made and before coating 520 is removed. The wet chemical etch will remove any defects that may have been introduced by the cutting and will clean the surface of any saw debris.

Figure 8:
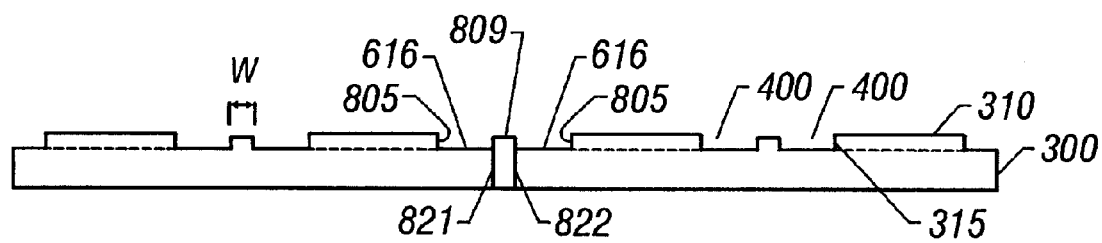
FIG. 8 illustrates another method of forming sections.

Other methods or combinations of methods can be used to obtain sections 700 having damage-free, or nearly damage-free edges 315 on die 310. For example, FIG. 8 illustrates a process in which nearly damage-free edges of die 310 are formed by using shallow, partial saw cuts, as discussed above, to create trenches 400. In the exemplary process illustrated in FIG. 8, more than one trench 400 is cut between each die 310, and only one sidewall 805 of each trench forms an edge 315 of the die 310. Depending on the final application of die 310, these shallow saw cuts may be followed with a wet chemical etch, as described in reference to FIG. 5D above. FIG. 8 illustrates trenches 400 formed without a protective coating, such as coating 520 of FIGS. 5A and 5B. However, a protective coating may be used for the partial sawing and typically is used if a wet chemical etch is to be performed.

As shown in FIG. 8, a portion 809 of the wafer 300 is left between trenches 400 after trenches 400 are made. Portion 809 is typically removed when cutting wafer 300 into sections 700. In one embodiment, the with W of portion 809 is less than the width of the saw used to dice the wafer 300, and therefore all material in portion 809 is removed in the cut. Alternatively, two cuts through wafer 300 may be made along, for example, lines 822 and 821, so that the saw does not contact the edge 315 and a shelf 616 remains on each section.

Figure 9A:
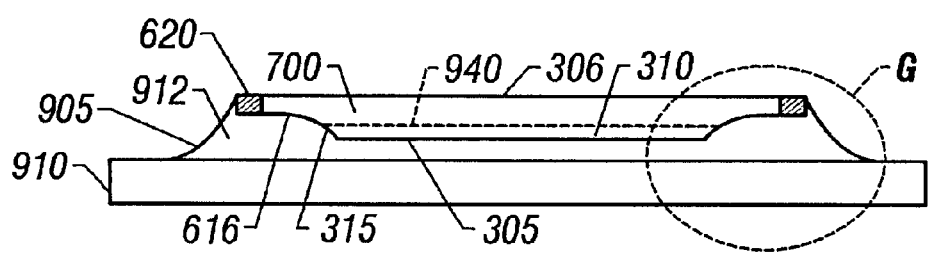
FIG. 9A is a sectional side view of a section of the wafer containing the die in a holder for thinning.

To finish forming the die 310 from sections 700, the back surface 306 of each section 700 is thinned until the back surface 940 of die 310 is reached. As illustrated in FIG. 9A, section 700 is mounted onto a holder 905 with the top surface 305 facing into holder 905 and bottom surface 306 exposed. In one embodiment, holder 905 is made of a substrate 910 and an adhesion material 912, which is used between the substrate 910 and the section 700.

Figure 9B:
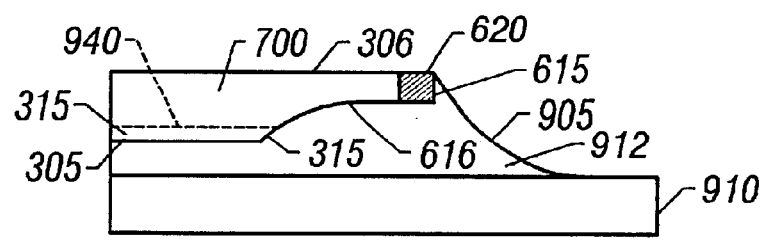
FIG. 9B is an enlarged view of section G of FIG. 9A showing the location of edge damage on the wafer section relative to the holder position.

Any thinning process, for example, polishing, lapping, etching, grinding, or diamond point turning, may be used to remove material from surface 306 to thin the wafer. As illustrated in FIGS. 9A and 9B, the damage 620 created by through-cut 610 is on the portion of section 700 to be removed by thinning, and, hence, damage 620 will be removed.

Figure 9C:
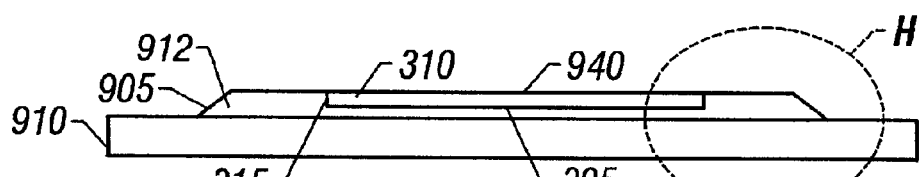
FIG. 9C is a sectional side view of the die in the holder after thinning.
Figure 9D:
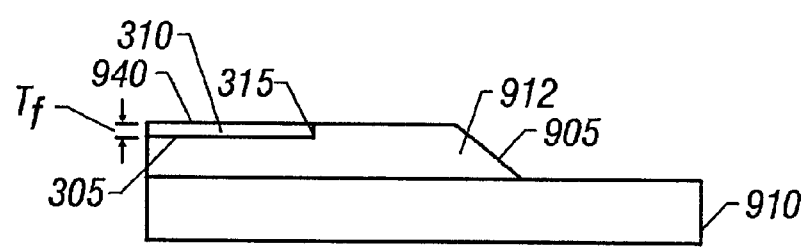
FIG. 9D is an enlarged view of section H of FIG. 9C.

As the thinning process continues, shelf 616 is removed. If the depth D of sidewall 405 was made just slightly larger than the desired thickness $T_f$ of the die, section 700 can be thinned until shelf 616 is removed to provide die 310 having the correct thickness. If viewed normal to surface 306, removal of shelf 616 provides a visual reference guide to the thickness of the section 700 being thinned, because as shelf 616 is removed, the area of surface 306 becomes smaller, until surface 940 is reached. As illustrated in FIGS. 9C and 9D, the resulting die 310 is free of edge and surface damage.

The particular substrate 910 and adhesion material 912 used for holder 905 depends on the intended application of die 310. In one example, die 310 forms part of an infrared sensor, such as the infrared sensors described in U.S. Pat. No. 5,308,980 to Barton and U.S. Pat. No. 5,264,699 to Barton et al., incorporated herein by reference. In such an infrared sensor, die 310 may be an infrared sensitive crystal such as InSb, and substrate 910 is a silicon integrated circuit that functions as a readout chip for the infrared sensitive crystal. Typically, the IR sensor will also contain solder or indium bump bonds between die 310 and substrate 910, to electrically connect the infrared sensitive crystal to the readout chip. The die 310 and substrate 910 remain bonded together in the completed sensor, and therefore the adhesion material 912 is typically an epoxy capable of holding die 310 and substrate 910 together.

Examples of suitable epoxies for adhesion material 912 used in such a sensor include, for example, Bondline 7247 and 6460 (Bondline Electronic Adhesives, San Jose, Calif.).

These epoxies are chosen to be both chemically and physically compatible with all Processing steps used to make the sensor and with conditions under which the completed sensor is operated. For example, the epoxies can withstand the temperature changes encountered when detector is in use.

In another embodiment, the substrate 910 is simply a mechanical support for die 310 and adhesion material 912 is a material, for example a parafin or bees wax, that allows die 310 to be easily removed from the substrate when the thinning process is complete.

The embodiments described above are intended to be illustrative only, and not limiting. Many variations and modifications in accordance with the invention will be evident to those of skill in the art. Therefore, the appended claims are to encompass all such changes and modifications as falling within the scope of this invention.

What is claimed is:

1. A method of forming a die from a wafer comprising:
   forming a trench in a first surface of said wafer around said die wherein a portion of at least one sidewall of said trench is a peripheral edge of said die, a depth of said sidewall is at least as large as a thickness of said edge, and minimal damage is done to said die by forming said trench;
   producing a through-cut from a bottom surface of said trench to a second surface of said wafer opposite said first surface to form a section containing said die, wherein said through-cut is displaced from said edge by a length, thereby creating a shelf of said length on said section between said edge and said through-cut;
   mounting said one or more sections onto a holding member; and
   thinning said one or more section from said second surface until a distance between said first and second surfaces is said thickness.

2. The method of claim 1, wherein forming said trench comprises removing material from said first surface by a method consisting of partial sawing, wet chemical etching, reactive ion etching, ion milling, or a combination thereof.

3. The method of claim 1, further comprising covering said die with a protective coating on said first surface.

4. The method of claim 1, wherein forming said trench comprises:
   covering said first surface with a protective coating, said protective coating having a pattern of openings;
   etching said first surface through said openings; and
   removing said coating.

5. The method of claim 4, further comprising partial sawing said first surface through said openings.

6. The method of claim 1, wherein producing said through-cut comprises cutting said wafer with a dicing saw.

7. The method of claim 1, wherein producing said through-cut further comprises covering said first surface and said trench with a protective coating.

8. The method of claim 1, wherein said length is at least 0.1 mm.

9. The method of claim 1, wherein said thinning consists of grinding, lapping, etching, polishing, diamond point turning, or combination thereof.

10. The method of claim 1, wherein said holding member comprises a substrate and an adhesive material between said first surface of said section and said substrate.

11. The method of claim 10, wherein said substrate is an integrated circuit readout chip, said adhesion material is an epoxy, and said die comprises an infrared sensitive crystal.

12. An infrared sensor device formed by the method of claim 11.

13. The method of claim 10, wherein said adhesion material is a wax, whereby said die is removable from said holding member.

14. The method of claim 1, wherein said wafer consists of Si, Ge, InSb, HgCdTe, CdTe, InGaAs, or combination thereof.

15. The method of claim 1, wherein said die comprises and integrated circuit chip.

16. The method of claim 1, wherein said thickness is in the range of 3 $\mu$m to 50 $\mu$m.

17. A method for forming die from a wafer comprising:

forming one or more trenches in a first surface of said wafer by a method consisting of partial sawing, wet chemical etching, reactive ion etching, ion milling, or a combination thereof, wherein a portion of sidewalls of said trenches from peripheral edges of said die and a depth of said sidewall is at least as large as a thickness of said peripheral edge;

cutting said wafer through said trenches with a dicing tool without contacting said edge of said die with said dicing tool to form one or more sections containing said die;

mounting said one or more sections onto a holding member with said first surface facing said holding member; and thinning said one or more sections from a second surface opposite said first surface until a distance between said first and second surfaces is said thickness.

18. The method of claim 17, wherein said holding member comprises an integrated circuit readout chip and an epoxy between said first surface of said section and said integrated circuit readout chip, and wherein said die comprises and infrared sensitive crystal.

19. An infrared sensor device formed by the method of claim 18.

20. A method for forming die from a wafer comprising:

covering a first surface of said wafer with a protective coating, said protective coating having etch openings;

partial sawing trenches into said first surface through said etch opening, wherein a portion of sidewalls of said trenches form peripheral edges of said die and a depth of said sidewalls is at least as large as a thickness of said peripheral edges;

wet chemical etching said trenches;

removing said coating;

cutting through said wafer in said trenches and at a distance from said edges, whereby said wafer is divided into one or more sections and each section contains a die;

mounting said one or more sections onto a holding member, wherein said first surface faces said holding member; and thinning said section from a second surface opposite said first surface until a width between said first and second surfaces is said thickness.

21. The method of claim 20, wherein the distance from said edges is at least 0.1 mm.

22. The method of claim 20, wherein said thinning comprises at least one of grinding, lapping, etching, and diamond point turning.

23. The method of claim 20, wherein said holding member comprises a substrate a substrate and an adhesive material is disposed between said first surface of said section and said substrate.

24. The method of claim 23, wherein said substrate is an integrated circuit readout chip and said die comprises an infrared sensitive crystal.

25. The method of claim 20, wherein said die comprises an integrated circuit chip.

26. An infrared sensor device formed by the method of claim 20.

27. The method of claim 20, wherein said thickness is in the range of 3 $\mu$m to 50 $\mu$m.

* * * * *